US012718898B2

(12) United States Patent
Zhang et al.

(10) Patent No.: US 12,718,898 B2
(45) Date of Patent: Aug. 25, 2026

(54) NAND DETECT PROGRAM COMPLETION (NDPC) WITH POWER OFF CHARGE LOSS CALIBRATION IN A MEMORY SUB-SYSTEM

(71) Applicant: Micron Technology, Inc., Boise, ID (US)

(72) Inventors: Peng Zhang, Los Altos, CA (US); Lei Lin, Fremont, CA (US); Zhengang Chen, San Jose, CA (US); Murong Lang, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 147 days.

(21) Appl. No.: 18/637,412

(22) Filed: Apr. 16, 2024

(65) Prior Publication Data

US 2024/0371450 A1 Nov. 7, 2024

Related U.S. Application Data

(60) Provisional application No. 63/499,568, filed on May 2, 2023.

(51) Int. Cl.

| | |
|---|---|
| ***G11C 16/34*** | (2006.01) |
| ***G11C 16/08*** | (2006.01) |
| ***G11C 16/26*** | (2006.01) |

(52) U.S. Cl.
CPC .......... *G11C 16/3459* (2013.01); *G11C 16/08* (2013.01); *G11C 16/26* (2013.01)

(58) Field of Classification Search
CPC ..... G11C 16/3459; G11C 16/08; G11C 16/26; G11C 11/5628; G11C 11/5642;
(Continued)

(56) References Cited

U.S. PATENT DOCUMENTS

| | | | |
|---|---|---|---|
| 2014/0133229 | A1 | 5/2014 | Kamei et al. |
| 2015/0332772 | A1 | 11/2015 | Kim et al. |

(Continued)

OTHER PUBLICATIONS

International Search Report and Written Opinion for International Application No. PCT/US2024/027288, mailed Aug. 20, 2024, 09 pages.

*Primary Examiner* — Amir Zarabian
*Assistant Examiner* — Bradley S Coon
(74) *Attorney, Agent, or Firm* — Lowenstein Sandler LP

(57) ABSTRACT

A system including a memory device and an operatively coupled processing device to perform operations including: responsive to detecting a power-up event, performing a first read strobe on a first set of a plurality of memory cells addressable by a first wordline, determining a value of a conductivity metric reflecting conductive states of one or more bitlines connected to the first set of the plurality of memory cells, determining, based on the value of the conductivity metric, a read level offset value for a second wordline, wherein the second wordline is adjacent to the first wordline, performing, using the read level offset value, a second read strobe on the second wordline, and responsive to determining that a value of a quality metric produced by the second read strobe satisfies a quality criterion, indicating that a programming operation performed on the second wordline was completed before a power off event.

15 Claims, 6 Drawing Sheets

(58) Field of Classification Search
CPC ..... G11C 16/0483; G11C 16/10; G11C 16/20; G11C 16/225; G11C 16/30
See application file for complete search history.

(56) References Cited

U.S. PATENT DOCUMENTS

2017/0358365 A1* 12/2017 Ray ...................... G11C 29/028
2019/0139614 A1 5/2019 Harada
2019/0147965 A1* 5/2019 Yim ...................... G06F 11/073
714/773

* cited by examiner

400

Responsive to detecting a power-up event, performing a first read strobe on a first set of a plurality of memory cells addressable by a first wordline 410

Determining a value of a conductivity metric reflecting conductive states of one or more bitlines connected to the first set of the plurality of memory cells 420

Determining, based on the value of the conductivity metric, a read level offset value for a second wordline, wherein the second wordline is adjacent to the first wordline 430

Performing, using the read level offset value, a second read strobe on the second wordline 440

Responsive to determining that a value of a quality metric produced by the second read strobe satisfies a quality criterion, indicating that a programming operation performed on the second wordline was completed before a power-off event 450

FIG. 4

Responsive to detecting a power-up event, performing a first read strobe on a first set of a plurality of memory cells addressable by a first wordline 510

↓

Determining a value of a conductivity metric reflecting conductive states of one or more bitlines connected to the first set of the plurality of memory cells 520

↓

Determining, based on the value of the conductivity metric, an updated value of a quality criterion for a second wordline, wherein the second wordline is adjacent to the first wordline 530

↓

Responsive to determining that a value of a quality metric produced by a second read strobe performed on the second wordline satisfies the updated value of the quality criterion, indicating that a programming operation performed on the second wordline was completed before a power-off event 540

FIG. 5

NAND DETECT PROGRAM COMPLETION (NDPC) WITH POWER OFF CHARGE LOSS CALIBRATION IN A MEMORY SUB-SYSTEM

RELATED APPLICATION

This application claims the benefit of U.S. Provisional Application No. 63/499,568 filed May 2, 2023, the entire contents of which are hereby incorporated by reference.

TECHNICAL FIELD

Embodiments of the disclosure relate generally to memory sub-systems, and more specifically, relate to NAND detect program completion (NDPC) with power off charge loss calibration in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 4 is a flow diagram of an example method for adjusting a read offset level value for an NDPC check, in accordance with some embodiments of the present disclosure.

FIG. 5 is a flow diagram of an example method for performing an NDPC check based on updated NDPC criteria, in accordance with some embodiments of the present disclosure.

DETAILED DESCRIPTION

Figure 1:
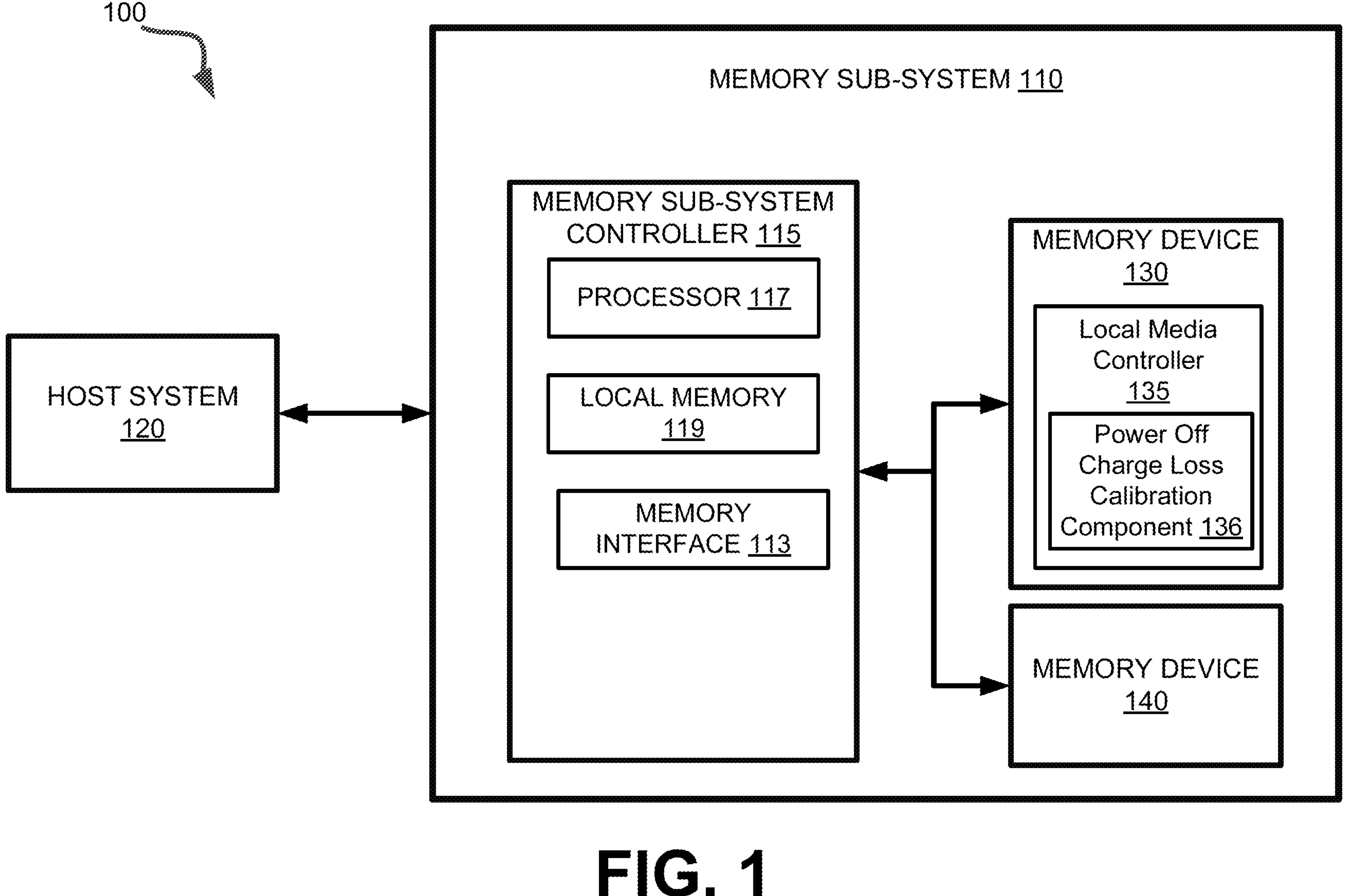
FIG. 1 illustrates an example computing system that includes a memory sub-system in accordance with some embodiments of the present disclosure.

Aspects of the present disclosure are directed to perform NAND Detect Program Completion (NDPC) with power off charge loss calibration in a memory sub-system. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. In some embodiments, a memory sub-system may be represented by a solid-state drive (SSD), which may include one or more non-volatile memory devices. In some embodiments, the non-volatile memory devices can be provided by negative-and (NAND) type flash memory devices. Other examples of non-volatile memory devices are described below in conjunction with FIG. 1. A non-volatile memory device is a package of one or more dice. Each die can include one or more planes. A plane is a portion of a memory device that includes multiple memory cells. Some memory devices can include two or more planes. For some types of non-volatile memory devices (e.g., NAND devices), each plane includes a set of physical blocks. Each block includes a set of pages. "Block" herein shall refer to a set of contiguous or non-contiguous memory pages. A "block" can refer to a unit of the memory device used to store data and can include a group of memory cells. An example of a "block" is an "erasable block," which is the minimal erasable unit of memory, while "page" is a minimal writable unit of memory. Each page includes a set of memory cells. A memory cell is an electronic circuit that stores information.

A memory device can include multiple memory cells arranged in a two-dimensional grid. The memory cells are formed onto a silicon wafer in an array of columns and rows. A memory cell includes a capacitor that holds an electric charge and a transistor that acts as a switch controlling access to the capacitor. Accordingly, the memory cell can be programmed (written to) by applying a certain voltage, which results in an electric charge being held by the capacitor. The memory cells are joined by wordlines, which are conducting lines electrically connected to the control gates of the memory cells, and bitlines, which are conducting lines electrically connected to the drain electrodes of the memory cells.

Depending on the cell type, each memory cell can store one or more bits of binary information and has various logic states that correlate to the number of bits being stored. The logic states can be represented by binary values, such as "0" and "1," or combinations of such values. A memory cell can be programmed (written to) by applying a certain voltage to the memory cell, which results in an electric charge being held by the memory cell, thus allowing modulation of the voltage distributions produced by the memory cell. A set of memory cells referred to as a memory page can be programmed together in a single operation, e.g., by selecting consecutive bitlines.

Precisely controlling the amount of the electric charge stored by the memory cell allows establishing multiple logical levels, thus effectively allowing a single memory cell to store multiple bits of information. A read operation can be performed by comparing the measured threshold voltages (Vt) exhibited by the memory cell to one or more reference voltage levels in order to distinguish between two logical levels for single-level cell (SLCs) and between multiple logical levels for multi-level cells.

Memory access operations (e.g., a programming (write) operation, an erase operation, etc.) can be executed with respect to sets of the memory cells, e.g., in response to receiving memory access commands from the host. A memory access operation can specify the requested memory access operation (e.g., write, erase, read, etc.) and a logical address, which the memory sub-system would translate to a physical address identifying a set of memory cells (e.g., a block).

A memory sub-system typically experiences random workloads and operating conditions, which can impact the threshold voltage distributions of memory cells in the memory sub-system causing the voltage distributions to shift to higher or lower values. This voltage distribution shift can occur regardless of whether the memory sub-system is powered-on or powered-off. In order to compensate for various voltage distribution shifts, calibration techniques can be performed to adjust the read levels. In some implementations, the adjustment can be performed based on values of one or more values (e.g., metadata values) returned from performing a memory access operation on a set of cells of the memory sub-system. While the memory sub-system is powered on, these calibration techniques can be performed in real time (e.g., in response to a detected voltage distribution shift) with recently obtained metadata values. However, when the memory sub-system is powered off, these calibration techniques can only be performed once the memory sub-system is powered on again. These calibration techniques can be performed after the memory sub-system is powered on again, but might rely on metadata values obtained before the memory sub-system was powered off. As a result, the lack of real-time metadata values can make it more difficult to determine how to compensate for voltage distributions shifts which occur while the memory sub-system is powered off. In some implementations, these calibration techniques can be effectively "blind" with respect to the voltage distribution of a set of cells because the calibration techniques do not account for voltage distributions experienced during a power off duration. These calibration techniques can rely on a memory sub-system being in a powered-on state, and when applied to a memory sub-system that has recently powered on from a power off duration, can produce inaccurate results.

A memory sub-system can perform various device health checks to determine what memory maintenance operations should be performed to retain data stored in the memory sub-system. In some implementations, a NAND Detect Program Completion (NDPC) check can be performed to determine whether programming of a set of cells (e.g., page, wordline, etc.) was completed prior to the power off event. The NDPC check can be performed based on default read trims and offsets without taking into consideration the charge loss during the powered-off duration. Because of charge loss that can occur during the power off duration, voltage distributions can shift and result in a high failed bit count. As a result, an NDPC check performed shortly after the memory sub-system is powered on can fail with the default read trims and offsets, when the data at the set of cells is otherwise intact and recoverable, but at a shifted voltage threshold. This can cause more pages of the memory device to be marked as power-loss impacted pages that is really accurate which can lead to a high overkill rate (e.g., unnecessary erase operations and garbage collection operations).

Aspects of the present disclosure address the above-noted and other deficiencies by applying, responsive to detecting a power-up event, a read strobe to a set of memory cells addressable by a wordline. The set of memory cells can be the memory cells on which a memory access operation is performed. "Read strobe" herein refers to an act of applying a read voltage level to a chosen wordline thus identifying the memory cells having their respective threshold voltages below and/or above the applied read level. A read operation can include one or more read strobes. Data state metrics can be obtained as metadata in response to the read strobe along with the sensed data. A "data state metric" herein refers to a quantity that is measured or inferred from the state of data stored on the memory device. Data state metrics can be used to characterize voltage distributions, and can reflect (i.e., is equal to or derived by a known transformation from) the conductive state of one or more bitlines connected to the memory cells (e.g., a conductivity metric), the state of slow charge loss, degree of latent read disturb, temporal voltage shift, and/or other measurable functions of the data state. For example, the data state metric can be represented by a raw bit error rate (RBER), which is the ratio of the number of erroneous bits to the number of all data bits stored in a certain portion of the memory device (e.g., in a specified data block). In another example, the data state metric can be represented by a bit error count (BEC). In some implementations, the conductivity metric portion of the data state metrics can include the failed byte count (CFByte), which reflects (i.e., is equal to or is derived by a known transformation from) the number of bytes in the sensed data that have at least one non-conducting bitline. In some implementations, the conductivity metric can include the failed bit count (CFBit), which reflects (i.e., is equal to or is derived by a known transformation from) the number of non-conducting bitlines in the sensed data.

After performing the read strobe, the controller can use the returned conductivity metric to determine the read level for the respective set of memory cells. In some implementations, the read level can be based on an adjusted read level (determined by the conductivity metric) and a base read level. The controller can perform, using the determined read level, a read strobe on an adjacent wordline. Responsive to determining that metadata received in response to the read strobe on the adjacent wordline satisfies a quality criterion, the controller can indicate that a memory access operation on the adjacent wordline (e.g., a programming operation) was completed before a power-off event. In some implementations, the quality criterion can be based on parameters of an NDPC check. While the examples described herein involve triple level cell (TLC) voltage distributions, in various other implementations, similar techniques can be implemented for memory pages storing other numbers of bits per cell.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a not-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), not-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a memory interface 113. Memory interface 113 is responsible for handling interactions of memory sub-system controller 115 with the memory devices of memory sub-system 110, such as memory device 130. For example, memory interface 113 can send memory access commands corresponding to requests received from host system 120 to memory device 130, such as program commands, read commands, or other commands. In addition, memory interface 113 can receive data from memory device 130, such as data retrieved in response to a read command or a confirmation that a program command was successfully performed. For example, the memory sub-system controller 115 can include a processor 117 (processing device) configured to execute instructions stored in local memory 119 for performing the operations described herein.

In one embodiment, memory device 130 includes a power off charge loss calibration component 136 configured to carry out memory access operations, e.g., in response to receiving memory access commands from memory interface 113. In some implementations, local media controller 135 includes at least a portion of power off charge loss calibration component 136 and is configured to perform the functionality described herein. In some implementations, power off charge loss calibration component 136 is implemented on memory device 130 using firmware, hardware components, or a combination of the above. In an illustrative example, power off charge loss calibration component 136 receives, from a requestor, such as memory interface 113, a request to perform an NDPC check on a set of memory cells of the memory device 130. An NDPC check can include a read strobe and other memory access operations. The memory device 130 can be configured to return, in response to the read strobe, one or more metadata values (e.g., data state metrics) to the power off charge loss calibration component 136. For example, the memory device can, upon performing a read strobe on a set of cells, return the failed byte count (CFByte), which reflects the number of bytes in the sensed data that have at least one non-conducting bitline for the set of cells. In another example, the memory device can, upon performing a read strobe, return the failed bit count (CFBit). The failed bit count reflects the number of non-conducting bitlines in the sensed data for the set of cells. In some embodiments, the NDPC check can include a read operation with a series of read strobes applied at certain read voltage levels to a wordline to compare estimated threshold voltages of the set of memory cells to expected read level positions of voltage distributions of the memory cells.

The data state metrics received from the memory device can be used by the memory sub-system controller 115 or local media controller 135 ("the controller") to adjust the read levels and/or passing criteria for an NDPC check for a neighboring set of cells. In some embodiments, the controller can use the data state metrics to index a data structure (e.g., a lookup table) mapping memory device-originated metadata values (e.g., failed byte counts or failed bit counts) to NDPC read voltage adjustment values for the neighboring set of cells. In some embodiments, the controller can use the data state metrics to index a data structure (e.g., a lookup table) mapping memory device-originated metadata values (e.g., failed byte counts or failed bit counts) to updated NDPC pass criteria adjustment values for the neighboring set of cells. Alternatively, the controller can compute either the read voltage adjustment value or updated NDPC pass criteria for the neighboring set of cells by applying a respective predefined mathematical transformation to the memory device-originated metadata values associated with the set of cells. Further details with regards to adjusting read levels and/or passing criteria for an NDPC check are described below.

Figure 2:
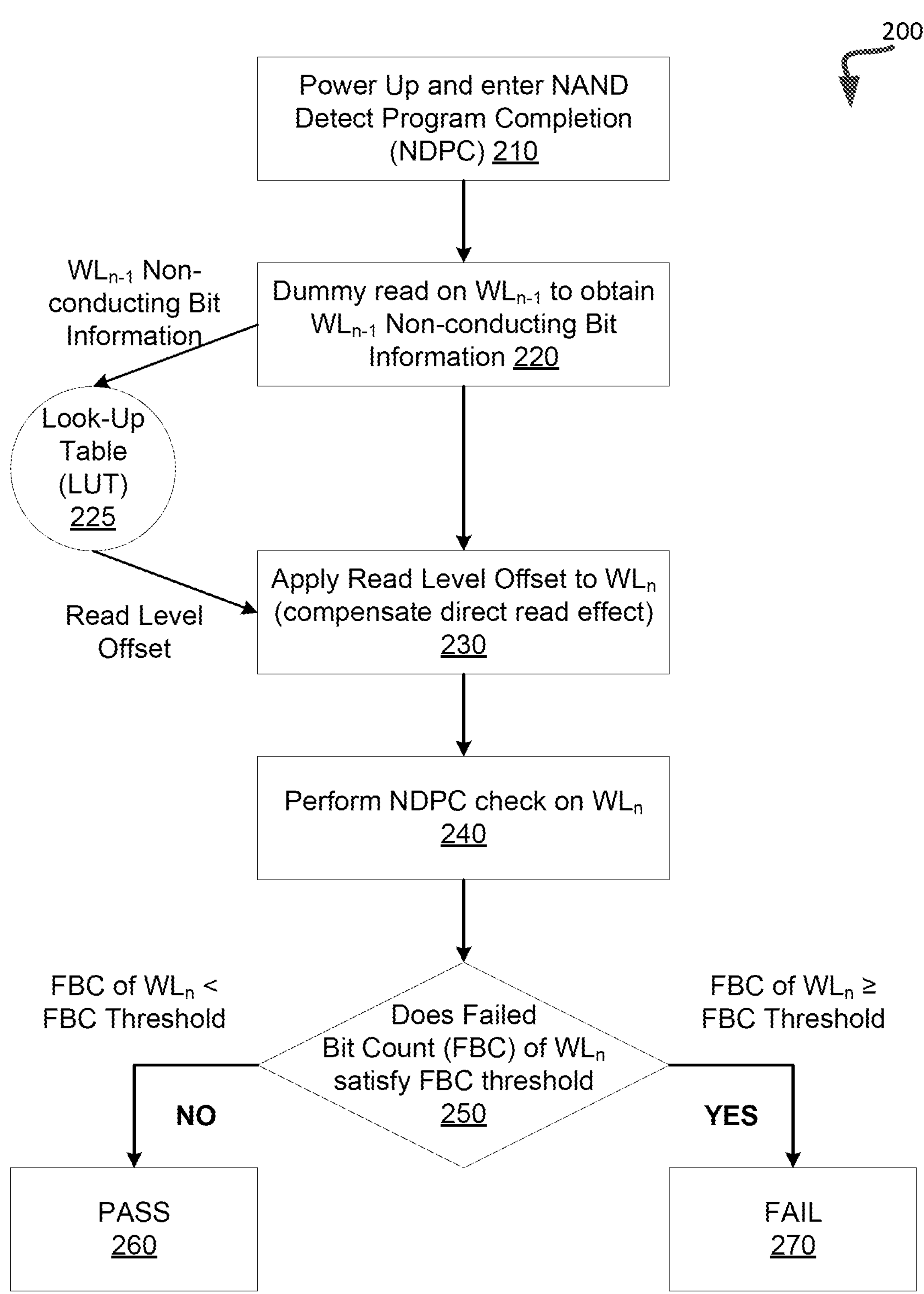
FIG. 2 is a flow diagram of an example method for adjusting a read offset level value for an NDPC check, in accordance with some embodiments of the present disclosure.

FIG. 2 is a flow diagram of an example method 200 for adjusting a read offset level value for an NDPC check, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the power off charge loss calibration component 136 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the memory device powers up and the controller implementing the method 200 initiates a NAND Detect Program Completion (NDPC) check. Upon powering up, the controller can automatically initiate the NDPC check based on operating conditions of the memory device, or an indication that the memory device experienced a power-loss event. In some embodiments, an indication that the memory device experienced a power-loss event can be a power-loss flag stored as metadata. A power off event can include synchronous events (i.e., planned shutdowns, where the memory sub-system can intentionally power off) and asynchronous events (i.e., unplanned shutdowns, where the memory sub-system unexpectedly loses power, such as due to removing external power from the memory sub-system). In an illustrative example, upon power up, a metadata flag can indicate whether the power-loss event was synchronous or asynchronous, and provided the power-loss event was asynchronous, the controller can initiate an NDPC check. In another example the controller can implement an NDPC check in response to metadata received from performing other memory access operations which metadata can indicate that an NDPC check should be performed.

At operation 220, the controller performs a dummy read on $WL_{n-1}$ to obtain non-conducting bit information associated with $WL_{n-1}$. Because wordlines are programmed sequentially and because the NDPC check is performed on the most recently programmed wordline (i.e., $WL_n$), the controller can presume that the programming of $WL_{n-1}$ was completed before the programming of $WL_n$ began. Using metadata associated with $WL_{n-1}$, the controller can determine the transformation (i.e., voltage distribution shift) of a complete programmed wordline (i.e., $WL_{n-1}$) due to the power-loss event. Upon determining the magnitude of the voltage distribution shift experienced by $WL_{n-1}$, the controller can approximate a similar voltage distribution shift for the most recently programmed wordline (i.e., $WL_n$). In some embodiments, the controller can presume the voltage distribution shift experienced by $WL_n$ is the same as the voltage distribution shift experienced by $WL_{n-1}$.

The metadata used by the controller can include a conductivity metric. The controller can use a conductivity metric (e.g., non-conducting bit information) to determine the voltage shift experienced by $WL_{n-1}$. In some embodiments, the non-conducting bit information can include a CFByte value and/or a CFBit value. As described above, CFByte reflects the number of bytes in the sensed data that have at least one non-conducting bitline for the set of cells, and CFBit reflects the number of non-conducting bitlines in the sensed data for the set of cells. In some embodiments, the NDPC check can be based on whether a CFByte and/or CFBit value satisfies a respective threshold condition.

At operation 225, the controller identifies a read level offset value from a lookup table based on the non-conducting bit information associated with $WL_{n-1}$. The lookup table can be a data structure (e.g., a metadata structure) which maps non-conducting bit information to a read level offset. In some embodiments, the lookup table can be pre-determined during production of the memory device, and values in the lookup table can be based on memory device characteristics, such as per-cell memory densities, die size, etc. The look up table can be stored as a metadata structure in local memory location of the memory sub-system, such as local memory 119 within memory sub-system controller 115 as described with respect to FIG. 1. In some embodiments, values of the lookup table can be modified by the controller based on operating conditions of the memory device.

At operation 230, the controller applies the read level offset value to the most recently written wordline ($WL_n$). The controller can add the read level offset value to a base read level value to determine an updated read level. The controller can then directly compensate for the voltage distribution shift experienced by the memory device (as determined at $WL_{n-1}$ in operation 220) by performing memory access operations using the updated read level. In some embodiments, the read level offset value and/or the updated read level can be stored as metadata. In some embodiments, the controller can use the read level offset value and/or the updated read level to determine a voltage distribution shift experience by other wordlines in the memory device.

At operation 240, the controller performs the NDPC check on $WL_n$ using the read level offset value identified in operation 225, and applied in operation 230. Memory access operations of the NDPC check can be performed using the updated read level of operation 230. In some embodiments, the operations of operation 230 and 240 can be performed in a single operation. For example, the controller can determine the updated read level based on the read level offset and perform memory access operations of the NDPC check based on the updated read level.

At operation 250, the controller determines whether the failed bit count (FBC) of $WL_n$ satisfies a FBC threshold. The FBC threshold can be a value that is pre-determined during production of the memory device. In some embodiments, the FBC threshold value can be determined for NDPC check operations performed with an updated read level offset value.

At operation 260, responsive to the FBC of $WL_n$ not satisfying the FBC threshold (e.g., FBC of $WL_n$<FBC threshold) the controller determines that $WL_n$ has passed the NDPC check. The controller can proceed to the next operation, such as a subsequent programming operation because the most recently programmed wordline ($WL_n$) before the power-loss event was programmed to completion before the power-loss event occurred.

At operation 270, responsive to the FBC of $WL_n$ satisfying the FBC threshold (e.g., FBC of $WL_n$≥FBC threshold) the controller determines that $WL_n$ has failed the NDPC check. The controller can flag the most recently programmed wordline ($WL_n$) for data recovery and/or reprogramming. In some embodiments, the data programmed to $WL_n$ can be retained in a write queue stored at a local memory location of the memory sub-system, and the controller can reprogram $WL_n$ from the write queue. In some embodiments, the controller can cause the data stored on the block containing the wordline to be copied to another block, and the block containing the wordline to be subsequently erased and queued for garbage collection (e.g., the controller can "fold" the block containing the wordline that failed the NDPC check).

Figure 3:
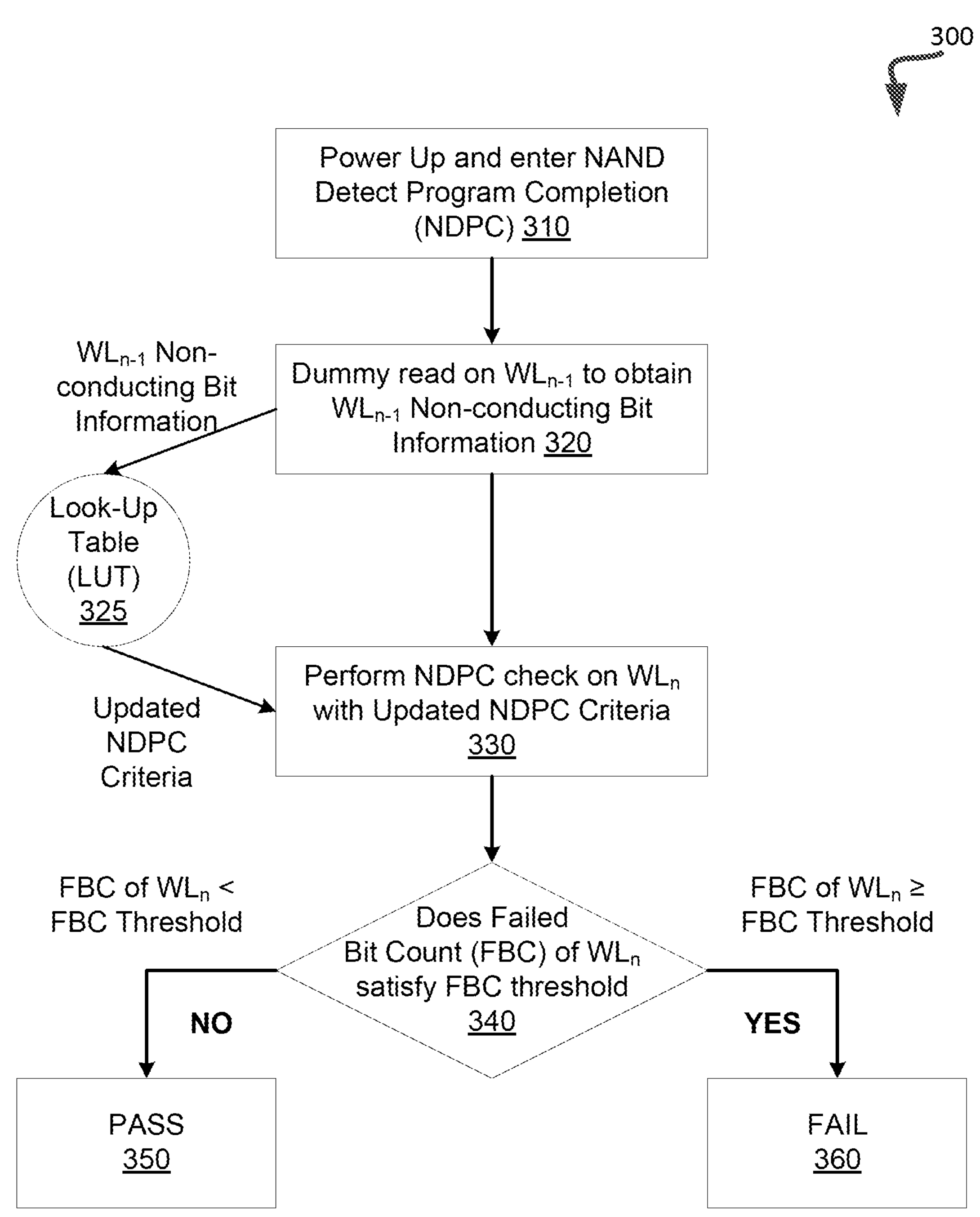
FIG. 3 is a flow diagram of an example method for performing an NDPC check based on updated NDPC criteria, in accordance with some embodiments of the present disclosure.

FIG. 3 is a flow diagram of an example method 300 for performing an NDPC check based on updated NDPC criteria, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the power off charge loss calibration component 136 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the memory device powers up and the controller implementing the method 200 initiates a NAND Detect Program Completion (NDPC) check. Upon powering up, the controller can automatically initiate the NDPC check based on operating conditions of the memory device, or an indication that the memory device experienced a power-loss event. In some embodiments, an indication that the memory device experienced a power-loss event can be a power-loss flag stored as metadata. A power-loss event can include synchronous events (i.e., planned shutdowns, where the memory sub-system can intentionally power off) and asynchronous events (i.e., unplanned shutdowns, where the memory sub-system unexpectedly loses power, such as due to removing external power from the memory sub-system). In an illustrative example, upon power up, a metadata flag can indicate whether the power-loss event was synchronous or asynchronous, and provided the power-loss event was asynchronous, the controller can initiate an NDPC check. In another example the controller can implement an NDPC check in response to metadata received from performing other memory access operations which metadata can indicate that an NDPC check should be performed.

At operation 320, the controller performs a dummy read on $WL_{n-1}$ to obtain non-conducting bit information associated with $WL_{n-1}$. Because wordlines are programmed sequentially and because the NDPC check is performed on the most recently programmed wordline (i.e., $WL_n$), the controller can presume that the programming of $WL_{n-1}$ was completed before the programming of $WL_n$ began. Using metadata associated with $WL_{n-1}$, the controller can determine the transformation (i.e., voltage distribution shift) of a complete programmed wordline (i.e., $WL_{n-1}$) due to the power-loss event. Upon determining the magnitude of the voltage distribution shift experienced by $WL_{n-1}$, the controller can approximate a similar voltage distribution shift for the most recently programmed wordline (i.e., $WL_n$). In some embodiments, the controller can presume the voltage distribution shift experienced by $WL_n$ is the same as the voltage distribution shift experienced by $WL_{n-1}$.

The metadata used by the controller can include a conductivity metric. The controller can use a conductivity metric (e.g., non-conducting bit information) to determine the voltage shift experienced by $WL_{n-1}$. In some embodiments, the non-conducting bit information can include a CFByte value and/or a CFBit value. As described above, CFByte reflects the number of bytes in the sensed data that have at least one non-conducting bitline for the set of cells, and CFBit reflects the number of non-conducting bitlines in the sensed data for the set of cells. In some embodiments, the NDPC check can be based on whether a CFByte and/or CFBit value satisfies a respective threshold condition.

At operation 325, the controller identifies an updated NDPC check criteria value from a lookup table based on the non-conducting bit information associated with $WL_{n-1}$. The updated NDPC check criteria can include less restrictive metadata threshold values for corresponding metadata values associated with the most recently programmed wordline ($WL_n$). For example, the less restrictive metadata threshold values can include updated CFBit and/or CFByte value (e.g., a larger value indicating a higher tolerance of error).

The lookup table can be a data structure (e.g., a metadata structure) which maps non-conducting bit information to an updated NDPC criteria. In some embodiments, the lookup table can be pre-determined during production of the memory device, and values in the lookup table can be based on memory device characteristics, such as per-cell memory densities, die size, etc. The look up table can be stored as a metadata structure in local memory location of the memory sub-system, such as local memory 119 within memory sub-system controller 115 as described with respect to FIG. 1. In some embodiments, values of the lookup table can be modified by the controller based on operating conditions of the memory device.

At operation 330, the controller performs the NDPC check on $WL_n$ based on the updated NDPC check criteria. The NDPC check based on the updated NDPC check criteria can be less restrictive than a standard NDPC check, and thus be more permissive of metadata values affected by the voltage distribution shift. In some embodiments, the NDPC check based on the updated NDPC check criteria can perform memory access operations with an updated read level, such as is described above with respect to operations 220-230 of FIG. 2.

At operation 340, the controller determines whether the failed bit count (FBC) of $WL_n$ satisfies an FBC threshold. The FBC threshold can be a value that is pre-determined during production of the memory device. In some embodiments, the FBC threshold value can be determined for NDPC check operations performed based on updated NDPC check criteria.

At operation 350, responsive to the FBC of $WL_n$ not satisfying the FBC threshold (e.g., FBC of $WL_n$<FBC threshold) the controller determines that the $WL_n$ has passed the NDPC check based on the updated NDPC criteria. The controller can proceed to the next operation, such as a subsequent programming operation because the most recently programmed wordline ($WL_n$) before the power-loss event was programmed to completion before the power-loss event occurred.

At operation 360, responsive to the FBC of $WL_n$ satisfying the FBC threshold (e.g., FBC of $WL_n$≥FBC threshold) the controller determines that $WL_n$ has failed the NDPC check based on the updated NDPC criteria. The controller can flag the most recently programmed wordline ($WL_n$) for data recovery and/or reprogramming. In some embodiments, the data programmed to $WL_n$ can be retained in a write queue stored at a local memory location of the memory sub-system, and the controller can reprogram $WL_n$ from the write queue. In some embodiments, the controller can cause the data stored on the block containing the wordline to be copied to another block, and the block containing the wordline to be subsequently erased and queued for garbage collection (e.g., the controller can "fold" the block containing the wordline that failed the NDPC check).

FIG. 4 is a flow diagram of an example method 400 for adjusting a read offset level value for an NDPC check, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the power off charge loss calibration component 136 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, responsive to detecting a power-up event, the controller performing the method 400 performs a first read strobe on a first set of memory cells addressable by a first wordline. In some embodiments, an indication (e.g., a flag) that the memory device experienced a power-loss event can be stored as metadata, and the controller can perform the first read strobe in response to the status of the power-loss flag. As described above, the read strobe can refer to applying a read voltage level to a chose wordline to identify the memory cells having a respective threshold voltage below and/or above the applied read level. The read strobe can return data state metrics (e.g., metadata) associated with the first set of memory cells in response to the read strobe. The data state metrics can be stored as a metadata table in a local memory location of the memory sub-system (e.g., such as local memory 119 of memory sub-system controller 115 as described with respect to FIG. 1). The data state metrics can include one or more indications of a conductivity metric for the first set of memory cells.

The power off event can be an asynchronous power-loss event. As described above, an asynchronous power loss can include unplanned shutdowns where the memory sub-system unexpectedly loses power, such as due to removing external power from the memory sub-system. In some embodiments, the power off event can be a synchronous power-loss event. As described above, a synchronous power loss event can include planned shutdowns, where the memory sub-system can intentionally prepare for a power off event.

At operation 420, the controller determines a value of a conductivity metric reflecting conductive states of one or more bitlines connected to the first set of cells of the plurality of memory cells. Information extracted from the conductivity metric can indicate a voltage distribution shift experienced by the set of cells. In some embodiments, the extracted information can indicate a voltage distribution shift experienced by the memory device. Because the conductivity metric reflects the conductive state of one or more bitlines connected to the set of memory cells, different values of the conductivity metric can indicate different magnitudes of voltage distribution shifts. For example, a large value of the conductivity metric (e.g., where more bitlines have a highly conductive state) can indicate a smaller voltage distribution shift, whereas a smaller value of the conductivity metric (e.g., where less bitlines have a highly conductive state, or where more bitlines have a near non-conductive state) can indicate a larger voltage distribution shift.

At operation 430, the controller determines a read level offset value for a second wordline based on the value of the conductivity metric. The second wordline can be adjacent to the first wordline. The second wordline can be a last programmed wordline and the first wordline can be a next-to-last programmed wordline. The conductivity metric can be associated with the next-to-last programmed wordline (i.e., the first wordline). Information extracted from the conductivity metric can indicate a voltage distribution shift experienced by the next-to-last programmed wordline (i.e., the first wordline). The voltage distribution shift experienced by the next-to-last programmed wordline can be used by the controller to determine the voltage distribution shift experienced by the last programmed wordline. In some embodiments, the controller can presume that the voltage distribution experienced by the next-to-last programmed wordline is the same as the voltage distribution experienced by the last programmed wordline.

The controller can identify the read level offset value from a metadata structure. The data structure can map values of the conductivity metric to values of a read level offset for a given wordline. The values of the metadata table can be determined during production of the memory device. In some embodiments, the values of the metadata table can be altered by the controller, for example, in response to operating conditions of the memory device. Larger magnitudes of read level offset values can be used to correct larger voltage distribution shifts (as determined by the conductivity metric), and smaller magnitudes of read level offset values can be used to correct smaller voltage distribution shifts (as determined by the conductivity metric).

In some embodiments, the controller can determine, based on the value of the conductivity metric, an updated quality criterion. The controller can identify the updated quality criterion from a metadata structure. The data structure can map values of the conductivity metric to values of the updated quality criterion for a given wordline. In some embodiments, the difference between the updated quality criterion and the initial quality criterion can depend on the magnitude of the voltage distribution shift. For example, the updated quality criterion can have a larger difference from the initial quality criterion for larger voltage distribution shifts, but a smaller difference from the initial quality criterion for smaller voltage distribution shifts.

At operation 440, the controller performs, using the read level offset value, a second read strobe on the second wordline. The information about the voltage distribution shift gained from the first read strobe on the first wordline can be used to perform a more accurate read strobe on the second wordline (i.e., the last programmed wordline). Without accounting for the voltage distribution shift the wordline might have experienced (e.g., during a power off duration), the read strobe performed on the last programmed wordline can return data state metrics that indicate an error in the last programmed wordline. This can be the result of an error in the performance of the read strobe, especially when, at adjusted read levels, there is no error in the last programmed wordline.

At operation 450, responsive to determining that a value of a quality metric produced by the second read strobe satisfies a quality criterion, the controller can indicate that a programming operation performed on the second wordline was completed before a power off event. The controller can move on to performing other memory access operations and/or memory maintenance operations accordingly.

In some embodiments, responsive to determining the value of the quality metric produced by the second read strobe does not satisfy the quality criterion, the controller can indicate that the programming operation performed on the second wordline was not completed before the power off event. The controller can re-program data to the second wordline. In some embodiments, the controller can flag (e.g., create or save an identifier for) the block which contains the wordline which was not programmed to completion before the power off event. In some embodiments, the controller can copy data from the block containing the uncompleted wordline to another block. The controller can then queue the block for garbage collection. In some embodiments, upon determining the quality metric of the wordline does not satisfy the quality criterion (e.g., the wordline does not pass the NDPC check), the controller can copy data from the block containing the non-passing wordline to another block, erase the block, and perform a garbage collection operation on the block.

In some embodiments, the controller can use the updated quality criterion described in operation 430. I.e., the controller can determine whether the value of the quality metric obtained by performing the read strobe on the last programmed wordline satisfies the updated quality criterion. The second read strobe can be performed using the read level offset value. In some embodiments, the controller can verify results obtained using the read level offset value by performing a second set of operations using the updated quality criterion. For example, after performing the operations of method 400, the controller can perform an additional read strobe on the last-programmed wordline without using the read level offset value (e.g., using a base read level) to determine whether the quality metric from the read strobe at the base read level satisfies the updated quality criterion.

FIG. 5 is a flow diagram of an example method 500 for performing an NDPC check based on updated NDPC criteria, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the power off charge loss calibration component 136 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, responsive to detecting a power-up event, the controller performing the method 500 performs a first read strobe on a first set of memory cells addressable by a first wordline. In some embodiments, an indication (e.g., a flag) that the memory device experienced a power-loss event can be stored as metadata, and the controller can perform the first read strobe in response to the status of the power-loss flag. As described above, the read strobe can refer to applying a read voltage level to a chose wordline to identify the memory cells having a respective threshold voltage below and/or above the applied read level. The read strobe can return data state metrics (e.g., metadata) associated with the first set of memory cells in response to the read strobe. The data state metrics can be stored as a metadata table in a local memory location of the memory sub-system (e.g., such as local memory 119 of memory sub-system controller 115 as described with respect to FIG. 1). The data state metrics can include one or more indications of a conductivity metric for the first set of memory cells.

The power off event can be an asynchronous power-loss event. As described above, an asynchronous power loss can include unplanned shutdowns where the memory sub-system unexpectedly loses power, such as due to removing external power from the memory sub-system. In some embodiments, the power off event can be a synchronous power-loss event. As described above, a synchronous power loss event can include planned shutdowns, where the memory sub-system can intentionally prepare for a power off event.

At operation 520, the controller determines a value of a conductivity metric reflecting conductive states of one or more bitlines connected to the first set of memory cells of the plurality of memory cells. Because the conductivity metric reflects the conductive state of one or more bitlines connected to the set of memory cells, different values of the conductivity metric can indicate different magnitudes of voltage distribution shifts. For example, a large value of the conductivity metric (e.g., where more bitlines have a highly conductive state) can indicate a smaller voltage distribution shift, whereas a smaller value of the conductivity metric (e.g., where less bitlines have a highly conductive state, or where more bitlines have a near non-conductive state) can indicate a larger voltage distribution shift.

At operation 530, the controller determines based on the value of the conductivity metric, an updated value of a quality criterion for a second wordline, wherein the second wordline is adjacent to the first wordline. The second wordline can be adjacent to the first wordline. The second wordline can be a last programmed wordline and the first wordline can be a next-to-last programmed wordline. The conductivity metric can be associated with the next-to-last programmed wordline (i.e., the first wordline). Information extracted from the conductivity metric can indicate a voltage distribution shift experienced by the next-to-last programmed wordline (i.e., the first wordline). The voltage distribution shift experienced by the next-to-last programmed wordline can be used by the controller to determine the voltage distribution shift experienced by the last programmed wordline. In some embodiments, the controller can presume that the voltage distribution experienced by the next-to-last programmed wordline is the same as the voltage distribution experienced by the last programmed wordline.

The controller can determine, based on the value of the conductivity metric, an updated quality criterion. The controller can identify the updated quality criterion from a metadata structure. The data structure can map values of the conductivity metric to values of the updated quality criterion for a given wordline. The values of the metadata table can be determined during production of the memory device. In some embodiments, the values of the metadata table can be altered by the controller, for example, in response to operating conditions of the memory device. The difference between the updated quality criterion and the initial quality criterion can depend on the magnitude of the voltage distribution shift. For example, the updated quality criterion can have a larger difference from the initial quality criterion for larger voltage distribution shifts, but a smaller difference from the initial quality criterion for smaller voltage distribution shifts.

In some embodiments the controller can determine, based on the value of the conductivity metric, a read level offset. The controller can identify the read level offset value from a metadata structure. The data structure can map values of the conductivity metric to values of a read level offset for a given wordline. The values of the metadata table can be determined during production of the memory device. In some embodiments, the values of the metadata table can be altered by the controller, for example, in response to operating conditions of the memory device. In some embodiments, different read offset values can be used to correct different voltage distribution shifts. For example, larger magnitudes of read level offset values can be used to correct larger voltage distribution shifts (as determined by the conductivity metric), and smaller magnitudes of read level offset values can be used to correct smaller voltage distribution shifts (as determined by the conductivity metric).

At operation 540, responsive to determining that a value of a quality metric produced by a second read strobe performed on the second wordline satisfies the updated value of the quality criterion, the controller indicates that a programming operation performed on the second wordline was completed before a power off event. The controller can move on to performing other memory access operations and/or memory maintenance operations accordingly.

In some embodiments, responsive to determining the value of the quality metric produced by the second read strobe does not satisfy the quality criterion, the controller can indicate that the programming operation performed on the second wordline was not completed before the power off event. The controller can re-program data to the second wordline. In some embodiments, the controller can flag (e.g., create or save an identifier for) the block which contains the wordline which was not programmed to completion before the power off event. In some embodiments, the controller can copy data from the block containing the uncompleted wordline to another block. The controller can then queue the block for garbage collection. In some embodiments, upon determining the quality metric of the wordline does not satisfy the quality criterion (e.g., the wordline does not pass the NDPC check), the controller can copy data from the block containing the non-passing wordline to another block, erase the block, and perform a garbage collection operation on the block.

In some embodiments, the controller can use the read level offset described in operation 530. I.e., the controller can determine whether the value of the quality metric obtained by performing the read strobe on the last programmed wordline using the read level offset satisfies the updated quality criterion. In some embodiments, the controller can verify results obtained using the updated quality criterion by performing a second set of operations using the read level offset (such as the operations of method 400 described above with reference to FIG. 4). For example, after performing the operations of method 500, the controller can perform some or all of the operations of method 400 to verify the results obtained from method 500.

Figure 6:
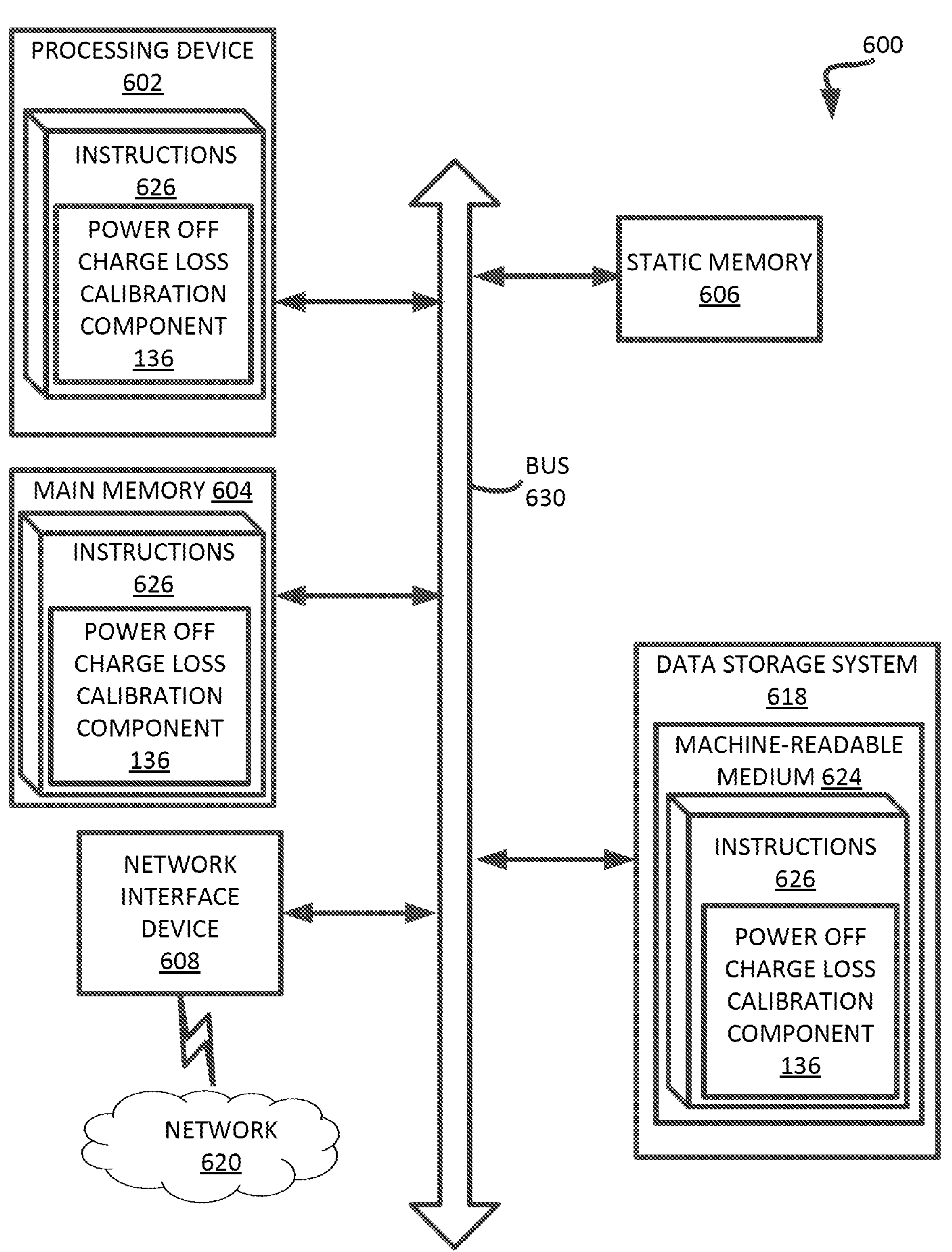
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the memory interface 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term “machine” shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a charge loss calibration component (e.g., the power off charge loss calibration component 136 of FIG. 1). While the machine-readable storage medium 624 is shown in an example embodiment to be a single medium, the term “machine-readable storage medium” should be taken to include a single medium or multiple media that store the one or more sets of instructions. The term “machine-readable storage medium” shall also be taken to include any medium that is capable of storing or encoding a set of instructions for execution by the machine and that cause the machine to perform any one or more of the methodologies of the present disclosure. The term “machine-readable storage medium” shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:

a memory device; and a processing device, operatively coupled with the memory device, to perform operations comprising:

responsive to detecting a power-up event, performing a first read strobe on a first set of a plurality of memory cells addressable by a first wordline;

determining a value of a conductivity metric reflecting conductive states of one or more bitlines connected to the first set of the plurality of memory cells addressable by the first wordline;

determining, based on the value of the conductivity metric, a read level offset value for a second wordline, wherein the second wordline is adjacent to the first wordline;

performing, using the read level offset value for the second wordline, a second read strobe on the second wordline;

determining, based on the value of the conductivity metric, a quality criterion; and responsive to determining that a value of a quality metric produced by the second read strobe satisfies the quality criterion, indicating that a programming operation performed on the second wordline was completed before a power off event.

2. The system of claim 1, wherein the operations further comprise:

responsive to determining the value of the quality metric produced by the second read strobe does not satisfy the quality criterion, indicating that the programming operation performed on the second wordline was not completed before the power off event; and re-programming data to the second wordline.

3. The system of claim 1, wherein determining, based on the value of the conductivity metric, the read level offset value for the second wordline comprises:

identifying, using a first data structure which maps values of the conductivity metric to values of a read level offset for a given wordline, the read level offset value for the second wordline.

4. The system of claim 1, wherein determining, based on the value of the conductivity metric, the quality criterion comprises:

identifying, using a second data structure which maps values of the conductivity metric to values of the quality criterion, the quality criterion.

5. The system of claim 1, wherein the power off event comprises an asynchronous power loss event.

6. The system of claim 1, wherein the second wordline is a last programmed wordline, and the first wordline is a next-to-last programmed wordline, and wherein information extracted from the conductivity metric of the next-to-last programmed wordline indicates a voltage distribution shift associated with the last programmed wordline, wherein a larger value of the conductivity metric indicates a smaller voltage distribution shift, wherein a smaller value of the conductivity metric indicates a larger voltage distribution shift.

7. A method comprising:

responsive to detecting a power-up event, performing, by a processing device, a first read strobe on a first set of a plurality of memory cells addressable by a first wordline;

determining a value of a conductivity metric reflecting conductive states of one or more bitlines connected to the first set of the plurality of memory cells addressable by the first wordline;

determining, based on the value of the conductivity metric, a read level offset value for a second wordline, wherein the second wordline is adjacent to the first wordline;

performing, using the read level offset value for the second wordline, a second read strobe on the second wordline;

determining, based on the value of the conductivity metric, a quality criterion; and responsive to determining that a value of a quality metric produced by the second read strobe satisfies the quality criterion, indicating that a programming operation performed on the second wordline was completed before a power off event.

8. The method of claim 7, comprising:

responsive to determining the value of the quality metric produced by the second read strobe does not satisfy the quality criterion, indicating that the programming operation performed on the second wordline was not completed before the power off event; and re-programming data to the second wordline.

9. The method of claim 7, wherein determining, based on the value of the conductivity metric, the read level offset value for the second wordline comprises:

identifying, using a first data structure which maps values of the conductivity metric to values of a read level offset for a given wordline, the read level offset value for the second wordline.

10. The method of claim 7, wherein determining, based on the value of the conductivity metric, the quality criterion comprises:

identifying, using a second data structure which maps values of the conductivity metric to values of the quality criterion, the quality criterion.

11. The method of claim 7, wherein the power off event comprises an asynchronous power loss event.

12. The method of claim 7, wherein the second wordline is a last programmed wordline, and the first wordline is a next-to-last programmed wordline, and wherein information extracted from the conductivity metric of the next-to-last programmed wordline indicates a voltage distribution shift associated with the last programmed wordline, wherein a larger value of the conductivity metric indicates a smaller voltage distribution shift, wherein a smaller value of the conductivity metric indicates a larger voltage distribution shift.

13. A computer-readable non-transitory storage medium comprising executable instructions that, when executed by a controller managing a memory device comprising a plurality of memory cells, cause the controller to:

responsive to detecting a power-up event, perform a first read strobe on a first set of a plurality of memory cells addressable by a first wordline;

determine a value of a conductivity metric reflecting conductive states of one or more bitlines connected to the first set of the plurality of memory cells addressable by the first wordline;

determine, based on the value of the conductivity metric, a read level offset value for a second wordline, wherein the second wordline is adjacent to the first wordline;

perform, using the read level offset value for the second wordline, a second read strobe on the second wordline;

determine, based on the value of the conductivity metric, a quality criterion; and responsive to determining that a value of a quality metric produced by the second read strobe satisfies the quality criterion, indicate that a programming operation performed on the second wordline was completed before a power off event.

14. The computer-readable non-transitory storage medium of claim 13, wherein the power off event comprises an asynchronous power loss event.

15. The computer-readable non-transitory storage medium of claim 13, wherein the second wordline is a last programmed wordline, and the first wordline is a next-to-last programmed wordline, and wherein information extracted from the conductivity metric of the next-to-last programmed wordline indicates a voltage distribution shift associated with the last programmed wordline, wherein a larger value of the conductivity metric indicates a smaller voltage distribution shift, wherein a smaller value of the conductivity metric indicates a larger voltage distribution shift.

* * * * *